United States Patent [19]

Eriksson et al.

[11] Patent Number: 5,844,414

[45] Date of Patent: Dec. 1, 1998

[54] METHOD AND A SYSTEM FOR MOVING A MEASURING MEANS ABOVE A TEST OBJECT

[76] Inventors: Anders Eriksson, Loftvagen 5, S-782 35 Malung; Jan Eriksson, Hjulslatt 2382; Per Ohman, Ungarde 2, both of S-780 64 Lima, all of Sweden

[21] Appl. No.: 776,314
[22] PCT Filed: Jul. 31, 1995
[86] PCT No.: PCT/SE95/00901
  § 371 Date: Jan. 29, 1997
  § 102(e) Date: Jan. 29, 1997
[87] PCT Pub. No.: WO96/04562
  PCT Pub. Date: Feb. 15, 1996

[30] Foreign Application Priority Data

Jul. 29, 1994 [SE] Sweden .................................. 9402604

[51] Int. Cl.⁶ ............................ G01R 29/08; G01R 31/28
[52] U.S. Cl. ............................................ 324/627; 343/703
[58] Field of Search ........................... 374/124; 343/703; 324/627

[56] References Cited

U.S. PATENT DOCUMENTS

| | | |
|---|---|---|
| 4,544,883 | 10/1985 | Grimsland . |
| 4,755,749 | 7/1988 | Olkubo et al. . |
| 4,840,496 | 6/1989 | Elleman ................................. 374/124 |
| 5,066,921 | 11/1991 | Rope ...................................... 343/703 |
| 5,119,017 | 6/1992 | Labarre et al. . |
| 5,432,523 | 7/1995 | Simmers ................................. 343/703 |
| 5,483,068 | 1/1996 | Moulton ................................. 374/124 |

FOREIGN PATENT DOCUMENTS 2014624 6/1994 Russian Federation ............... 343/703

OTHER PUBLICATIONS

Modern Elektronik, vol., No. 19, Nov. 1982, Mats Viggh, "Signalmatningar — metoder och instrument", p. 36 –p. 38, The last portion in col. 5 at p. 38.

Patent Abstracts of Japan, vol. 18, No. 125, P–1701, abstract of JP, A, 5–312867 (Tochigi Pref Gov), 26 Nov. 1993.

Primary Examiner—Josie Ballato
Assistant Examiner—Jose M. Solis
Attorney, Agent, or Firm—Young & Thompson

[57] ABSTRACT

A system and a method for moving a measuring device (4, 30) to a plurality of positions above a test object (12), e.g. an electrically or electronically equipped printed board, at which the EMC, of the test object (12) is measured and later stored in a memory together with the position of the measuring device. The system includes a computer (18) and a measuring device (4, 30). The positioning device (8) moves the measuring device (3, 30) across the test object (12) from one position to another, wherein the number of positions and their coordinates are preselected and stored in a computer (18) for a later repetition of the measurement. Each position is assigned with a measurement value which is stored in the memory of the computer (18) together with the coordinates of the measuring device (4, 30). At each position, the power to the control devices is shut-off, in order to minimize interference with the measurements.

11 Claims, 9 Drawing Sheets

METHOD AND A SYSTEM FOR MOVING A MEASURING MEANS ABOVE A TEST OBJECT

FIELD OF THE INVENTION

The present invention relates to a method and a system for repeatedly, by means of a positioning device, moving a measuring means to a plurality of positions above a test object, e.g. an electrically or electronically equipped printed board, at which the electromagnetic compatibility, hereinafter referred to as EMC, and/or the temperature is measured at each of the plurality of positions, and thereafter said measuring values are stored in a memory together with the position (coordinates) of said measuring means. A test object could in the case of measuring the EMC be any object that causes or is affected by interference, and in the case of measuring the temperature the test object could be virtually any object, of which the temperature is of interest, such as electronic equipment, humans etc.

BACKGROUND OF THE INVENTION

The requirements on electronic equipment released onto the market are becoming greater and greater. One of the requirements which modules in electronic equipment must meet concerns emission and immunity (EMC), i.e. electronic equipment is not allowed to cause interference in other electronic equipment or be affected by interference from such equipment themselves. The limits for EMC are set by national and international standards and have, during recent years, gradually become severer. In order to get a product out on the market it must first go through an EMC test and be approved by the country's equivalent to SEMKO (Sweden's Electric Measuring and Testing Unit).

Since changes in designs and redesigns are expensive and extend the time it takes for the product to reach the market, it is in the designer's interest to ensure, at an early stage, that the product will pass such an EMC test if production costs are to be kept to a minimum.

One problem with the design of electronic equipment is that of locating and taking measures against sources of interference as early as possible in the design process in order to comply with the ever increasing requirements which are put on modules in electronic equipment.

Another problem in designing electronic equipment is that of locating where in the equipment the temperature is high. By acquiring such information the cooling of the relevant components can be optimised thus increasing the life of the product.

THE STATE OF ART

The means by which the designer today can measure EMC lack precision and/or are expensive. In order to measure EMC during the design of the product the designer manually scans the electrically or electronically equipped printed circuit (module) by hand with a measuring probe which via an amplifier is connected to a spectrum analyser. The designer is able to see the frequency content of the source of interference on the spectrum analyser display, i.e. the emission of the printed board assembly in the position where the measuring probe is located.

However, the immunity of the printed board assembly is not measured with this method. Another disadvantage with this method is the lack of precision in measuring the position of the source of interference. Since the measuring probe is scanned manually over the printed board assembly it is difficult to fix the exact position of the source of interference. Although it is true that the source of interference, i.e. the component which causes the interference, is located, the exact position is not known and it is therefore difficult to carry out a new comparative measurement, after that the original interference has been reduced. Thus, there is a need to be able to carry out repeated EMC measurements in order to continuously get a picture of the EMC of printed board assembly during the design process.

Another method of checking the EMC of the printed board is to wait until the product in which the printed board assembly is installed undergoes a EMC test by SEMKO or an equivalent national authority. If the product does not fulfil the requirements of this test then the product must be redesigned. The disadvantage with this procedure is that the designer only is given the information about the limits which have been exceeded, i.e. only those frequencies from the source(s) of interference which exceed the prescribed limits, and not their location. Consequently, the designer, himself, must find the component(s) which is/are the cause of the limits being exceeded.

EP-0 480 720 describes a system and a method for analysing the bandwidth of a signal. A digital spectrum analyser is used to digitise the spectrum which is then loaded into a computer. The computer then scans this spectrum to determine a zero dB reference. Moreover, the holes or drop outs in the spectrum are located, counted and characterised. Consequently, this system and method analyses the spectrum of one single signal. However, EP-0 480 720 does not describe any methods for scanning a test object in order to collect and analyse the spectrum from a plurality of positions on the test object. Furthermore, this method and system is directed towards analysing the bandwidth of one signal and not towards analysing the EMC of a plurality of individual points in order to obtain a complete picture of a test object's frequency content and interference sensitivity, which is the case with the present invention.

SUMMARY OF THE INVENTION

The object of the invention is to provide, by means of a positioning device, a system for repeatedly moving a measuring means to a plurality of positions above a test object, e.g. an electrically or electronically equipped printed board, at which the EMC and/or the temperature is measured at each of the plurality of positions, and said measuring values subsequently are stored in a memory together with the position (coordinates) of said measuring means.

Another object of the invention is to provide a method to repeatedly measure the EMC and/or temperature at the test object with, for example, the above mentioned system.

The above mentioned objects are according to the present invention, realised in a system which comprises a programmable controller having a memory unit, a positioning device and a measuring means.

The present invention will now be described in detail with reference to the preferred embodiments and the accompanying drawings.

Different embodiments of invention will now be described, by way of examples.

EXAMPLE 1: Emission Measurement

Figure 1:
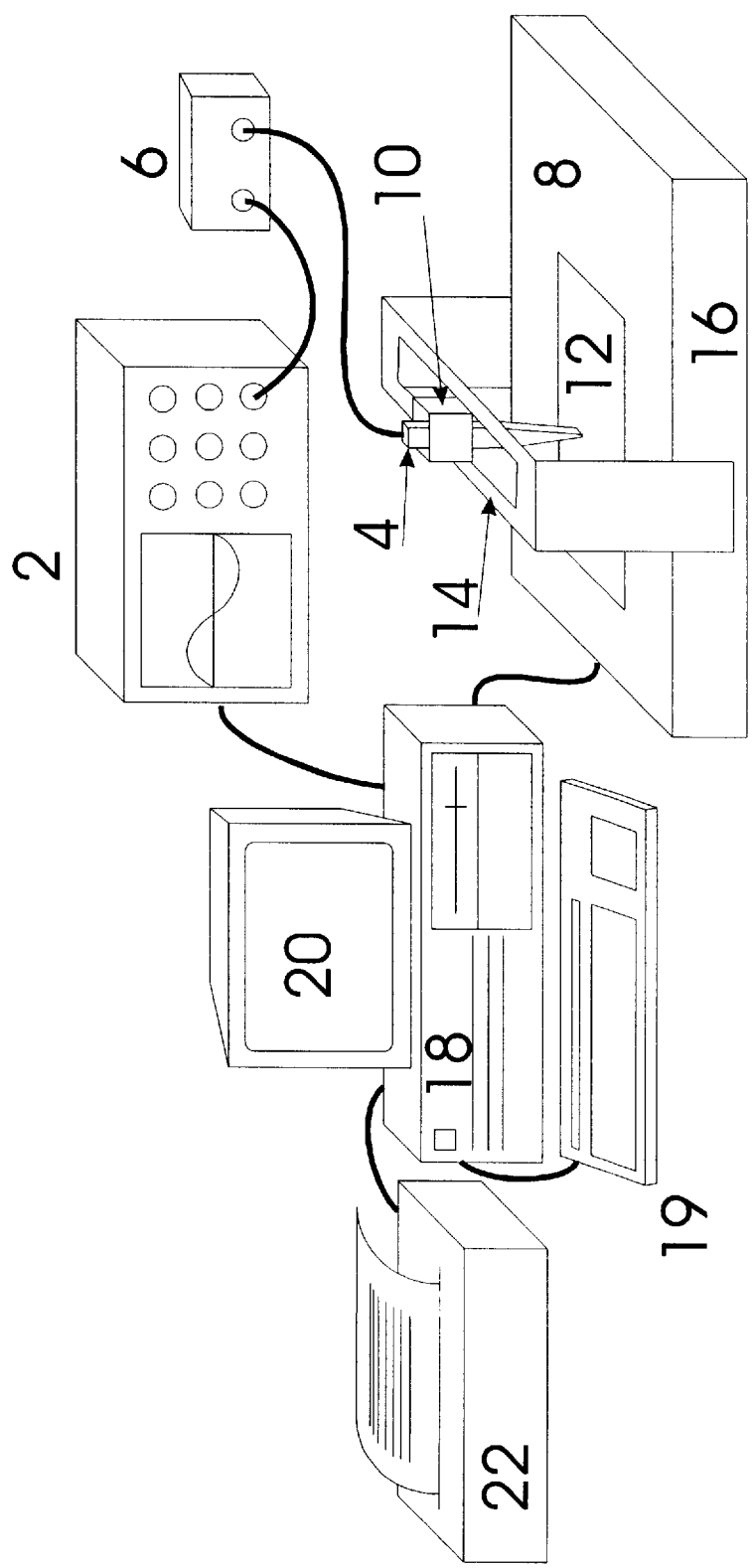
FIG. 1 shows an embodiment in which the system according to the present invention is used to measure emission.
Figure 4:
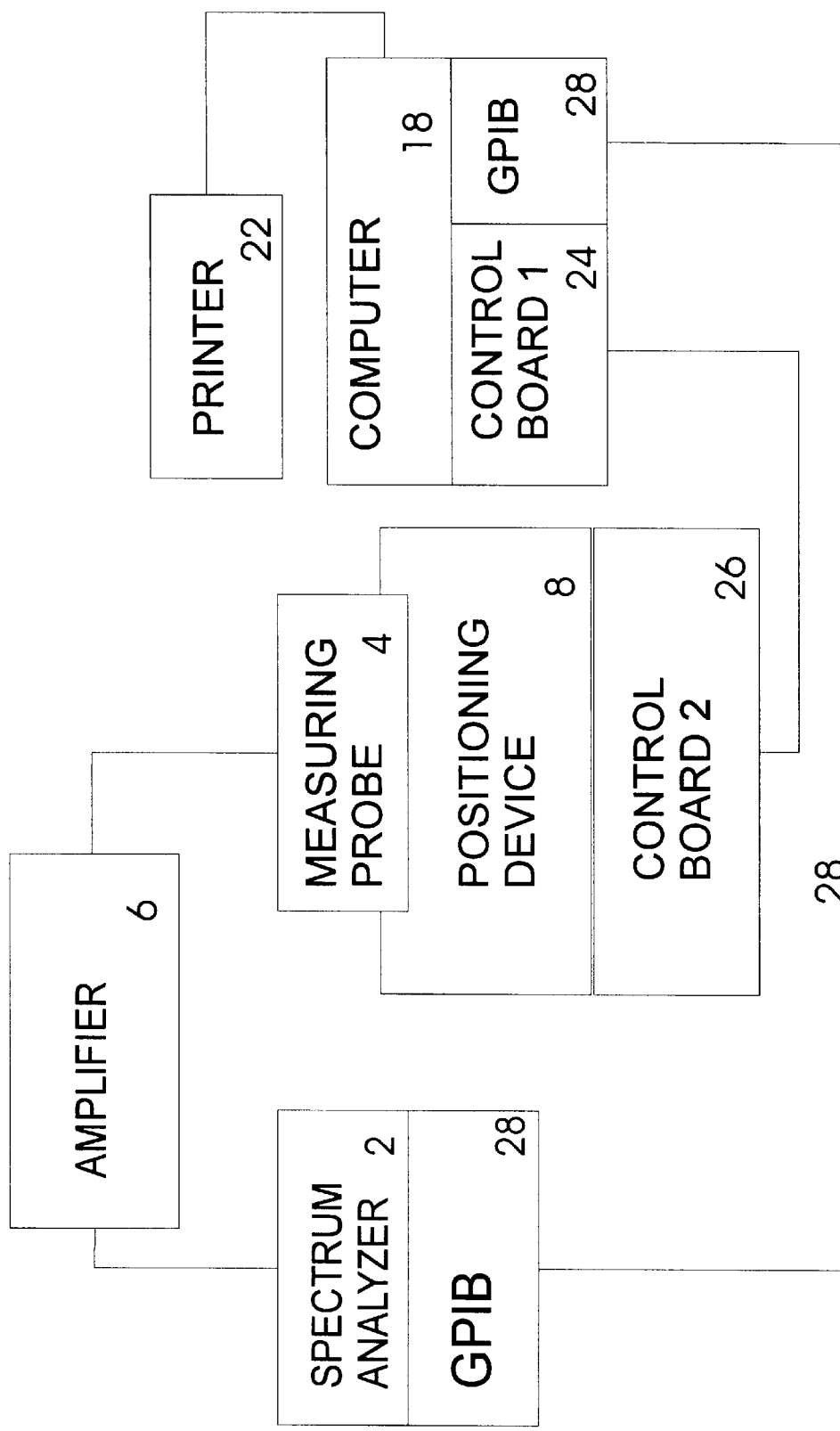
FIG. 4 is a circuit diagram showing the embodiment depicted in FIG. 1.

The system, illustrated in FIG. 1 and FIG. 4, for measuring the emission part of the EMC comprises a spectrum analyser 2, a measuring probe 4, an optional amplifier 6 for the measuring probe 4, a positioning device, preferably a coordinate table 8, which comprises a slider 10 which holds the measuring probe 4 and which slides over a test object 12 along an arm 14 and a driving unit 16 for moving the slider 10 and the arm 14 over the test object 12, a programmable controller with a memory unit, preferably a computer 18, a keyboard 19, a visual display unit 20, a printer 22, a primary and secondary control board 24 respectively 26 and a bus interface 28.

The measuring probe 4 which is used for measuring the emission part of the test object's 12 EMC is provided on the slider 10 and connected to the spectrum analyser 2, via the amplifier 6. The spectrum analyser 2 is in turn, via a bus interface 28, e.g. HPIB, connected to the computer 18 which collects and processes the measurement data obtained by the spectrum analyser 2 via the measuring probe 4 in order to visualise the processed data on the visual display unit 20. In order to control the coordinate table 8 the computer 18 is connected to the coordinate table's 8 driving unit 16, via the primary 24 and secondary control board 26.

The method for measuring the emission part of the test object's 12 EMC will now be described.

Is a test object 12, e.g. an electrically or electronically equipped printed board, to be measured for the first time, the system must first be configured. If this is the case a configuration form has to be chosen in a menu, when the system is initiated, in which form the user defines the hardware on which the program will operate, e.g. type of measuring probe 4, coordinate table 8, control boards 24, 26, printer 22, etc.

When this has been done it is time to initiate the measuring program. If the system has already been configured this is the first stage of the method. The method comprises, apart from the configuration, the following steps:

1. Initiate the measuring program.
2. Selection of the form, "Settings—coordinate table". In this form the user specifies, for example, start and end coordinates, increments in the x- and y- direction, start direction, speed, whether the z- coordinate should be fixed or relative, etc., to be used in the measuring method.
3. Selection of the form "Measurement settings—emission measurement". In this form the user specifies, for example, start and stop frequency, centre frequency, frequency span, sensitivity, band width, scan frequency, measuring unit, etc., to be used in the measuring method.
4. Initiation of the measurement by selecting the alternative "Measure" in the menu for emission measurement.
5. Showing the results of the measurement by selecting the alternative "Visualise" in the menu for emission measurement.
6. Documentation of the results of the measurement by selecting the alternative "Print" in the menu for emission measurement.

Figure 7:
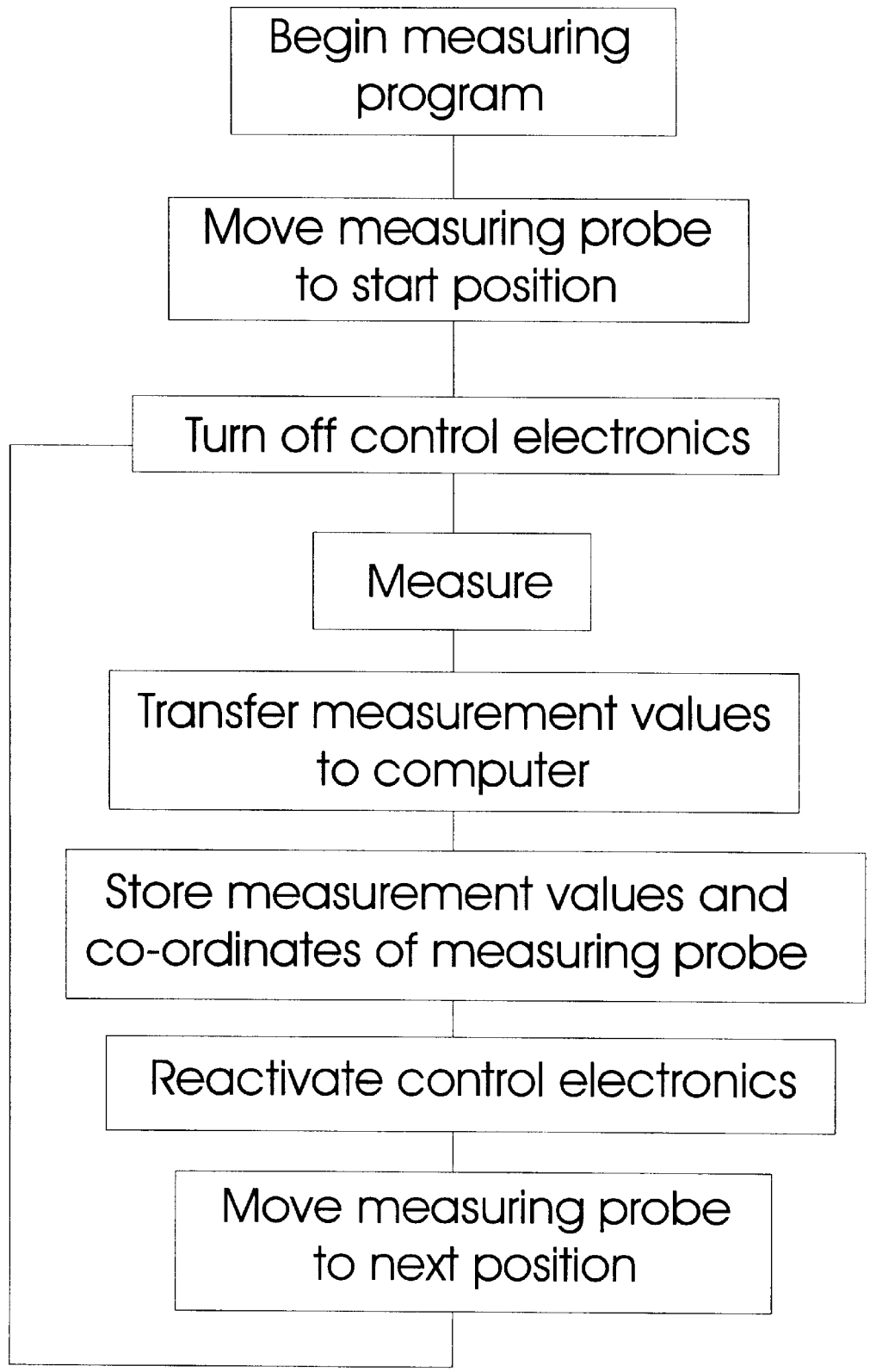
FIG. 7 is a flow-chart showing the method for measuring the emission according to the invention.

The measuring method itself, i.e. step 4 above, will now be described in detail. The measuring method is shown with help of a flow-chart in FIG. 7.

When all the settings for the measurement have been made and the measurement has been activated by selecting "Measure" in the menu for emission measurement, the program commands the coordinate table 8, via the primary control board 24, to move the measuring probe 4 to the start coordinates given in the form "Settings—Coordinate table". When the arm 14 and the slider 10, which hold the measuring probe 4 have reached the start coordinates above the test object 12 all control electronics of the coordinate table 8 are made dead, i.e. the control electronics are no longer connected to voltage. This is done to eliminate the effect that the control electronics otherwise would have on the result of the measurement. The program, via the HPIB-connection 28, then commands to start the measurement according to conditions specified in the form "Measurement settings—emission measurement". The spectrum analyser 2 then collects the measurement values from the measuring probe 4, via the amplifier 6, said measuring probe 4 being provided on the slider 10. The measurement values are, via the HPIB-connection 28, then transferred to the computer 18 where they are stored in the memory. The control electronics of the coordinate table 8 are then reactivated. The program now commands the coordinate table 8 to move to the next coordinates according to the conditions specified in the form "Settings—coordinate table". The measuring method then continues, as above, and is terminated when the end coordinates are reached and the spectrum analyser 2 has collected the final measurement value.

During the actual emission measurement it is possible to monitor the collected measurement values either directly, through the spectrum analyser's 2 display or on the visual display unit 20 which is connected to the computer 18. On the visual display unit 20 it is possible to either, in real time show the measurement value for the position at which the measuring probe 4 is at the moment or show this instantaneous value together with the preceding measurement values, i.e. the history of the measurement up to and including the last collected measurement value.

To obtain a more complete picture of the test object's 12 emission "Visualise" is then selected in the menu, when the measurement has been completed. The measurement values which have been processed by the computer 18 are here shown in diagrammatic form. By selecting different types of diagram with up to four dimensions, e.g. a frequency/amplitude diagram, a frequency/amplitude/position diagram, etc., it is easy for the designer to obtain very good information about a test object's emission. If any component exceeds the existing limits for emission the designer can immediately see where on the test object the interference is located.

Thus, with this method it is easy to find and reduce sources of interference early on in the design process. When the interference has been reduced it is, therefore, very simple to repeat the measurement under the same conditions, as during the first measurement which has not been possible with hitherto known methods.

The result, measurement settings and the coordinate table settings for each measurement can be stored in the computer 18 and constitute an excellent basis for the documentation of the design process advancement regarding emission. Of course, the result can also, by known means, be printed out by a printer 22.

EXAMPLE 2: Immunity Measurement

Figure 2:
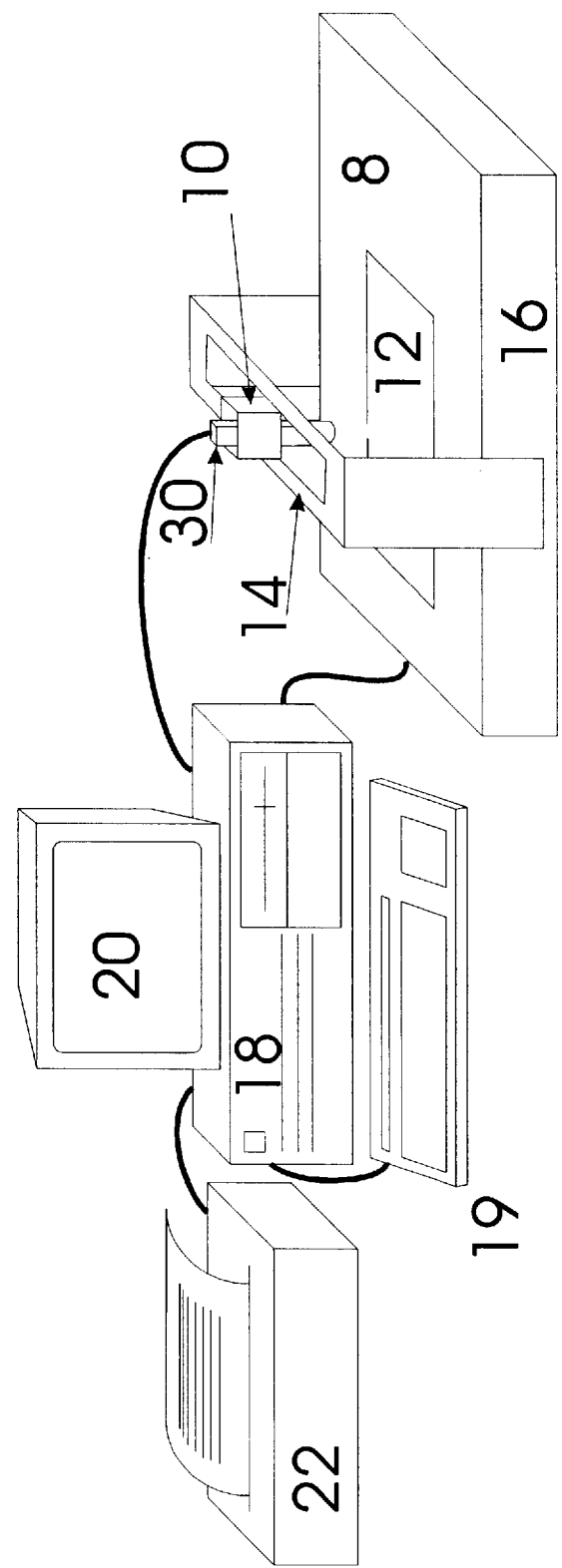
FIG. 2 shows an embodiment in which the system according to the present invention is used to measure immunity.
Figure 5:
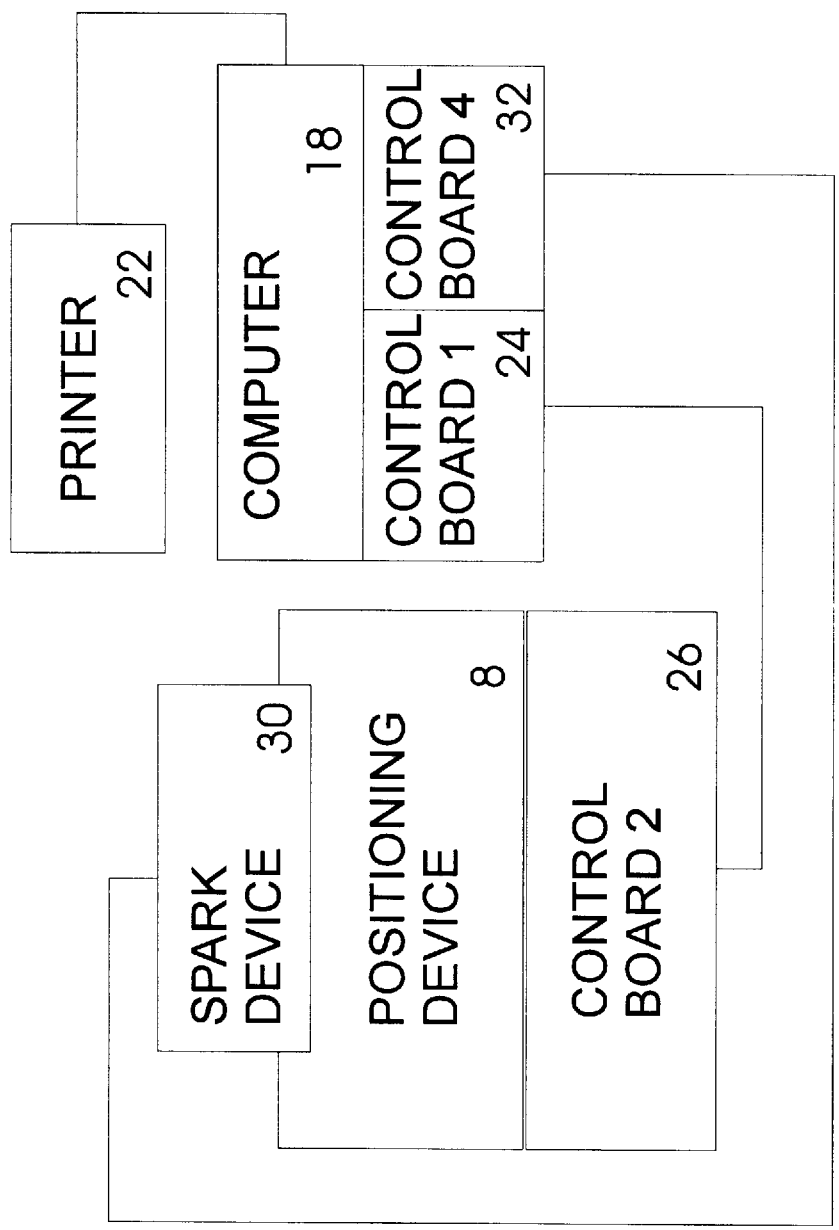
FIG. 5 is a circuit diagram showing the embodiment depicted in FIG. 2.

The system shown in FIG. 2 and FIG. 5 for measuring the immunity part of EMC comprises in substance the same parts as the system in FIG. 1 and FIG. 4. Same parts use the same reference numerals in both figures. The difference between the two systems is that the system for measuring immunity does not have a spectrum analyser 2 and that the measuring probe 4 and its optional amplifier 6 are replaced by a spark device 30 which generates an interference signal. The spark device 30 is connected to the computer 18 via a third control board 32 and provided on the slider 10 in a similar way as the measuring probe 4 in the previous example. The coordinate table 8 is controlled with help of the computer 18 in the same manner as in the above example. The computer 18 in this example is also used to collect, process and visualise measurement data.

Below, the method for measuring the immunity part of the test object's 12 EMC will now be described.

If it is the first measurement the system must first be configured to define which hardware is to be included in the system, exactly as in the previous example.

Besides the configuration the method comprises the following steps:
1. Initiate the measuring program.
2. Selection of the form, "Settings—coordinate table". In this form the user specifies, for example, start and end coordinates, increments in the x- and y- direction, start direction, speed, whether the z- coordinate should be fixed or relative, etc., to be used in the measuring method.
3. Selection of the form "Measurement settings—immunity measurement". In this form the user specifies, for example, whether the spark device 30 is to generate an interference pulse or an interference field and the length respectively strength thereof.
4. Initiation of the measurement by selecting the alternative "Measure" in the menu for immunity measurement.
5. Showing the results of the measurement by selecting the alternative "Visualise" in the menu for immunity measurement.
6. Documentation of the results of the measurement by selecting the alternative "Print" in the menu for immunity measurement.

Figure 8:
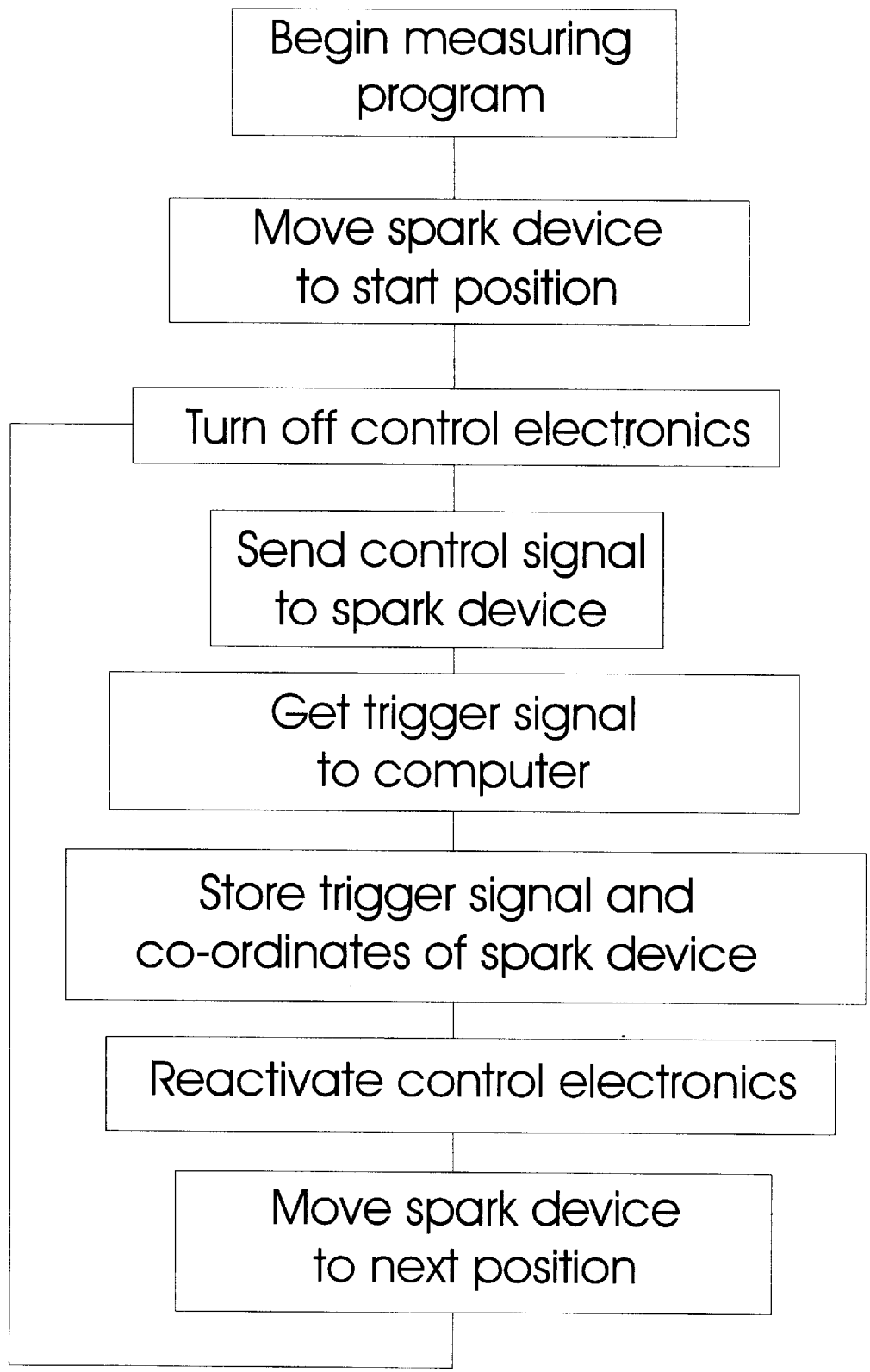
FIG. 8 is a flow-chart showing the method for measuring the immunity according to the invention.

The measuring method itself, i.e. step 4 above, will now be described in detail. The measuring method is shown with help of a flow-chart in FIG. 8.

When all the settings for the measurement have been made and the measurement has been activated by selecting "Measure" in the menu for immunity measurement, the program commands the coordinate table 8, via the primary control board 24, to move the spark device 30 to the start coordinates given in the form "Settings coordinate table". When the arm 14 and the slider 10, which hold the spark device 30 have reached the start coordinates above the test object 12 all control electronics of the coordinate table 8 are made dead. This carried out for the same reason as in the example above,. i.e. to eliminate the effect that the control electronics otherwise would have on the result of the measurement. There after a control signal is sent to the spark device 30 via the third control board 32, said spark device 30 emitting an interference signal in the form of an interference field or pulse. The computer 18 then receives a trigger signal from the test object 12, said trigger signal together with the coordinates for the position of the spark device 30 are stored in the computer's 18 memory. The trigger signal is a signal that is user chosen and usually has a position which is important to function of the test object 12. The trigger signal can either be analogue or binary. If it is binary either a positive response is received indicating that the test object 12 resists the interference signal generated by the spark device 30 or a negative response is received indicating that the test object 12 cannot handle the generated interference signal. An analogue trigger signal, of course, gives the user information about the signal level of the chosen position at the test object 12. When the computer 18 has received the trigger signal the control electronics of the coordinate table 8 are reactivated. The program now commands the coordinate table 8 to relocate the spark device 30 to the next coordinates according to the conditions specified in the form, "Settings—Coordinate Table". The measuring method then continues according to the above and terminates when the spark device 30 has reached its final coordinates and the last trigger signal, in response to the interference signal from the spark device 30, has been received.

In order to illustrate the immunity of the test object 12 following the measurement, "Visualise" is selected from the menu. The measurement values which have been processed by the computer 18 are here shown in diagrammatic form with up to four dimensions, e.g. in the form of a position/function diagram.

With the immunity measurement the designer receives information about where on the test object 12 the interference signal has caused function interference.

With this method it is therefore easy, at an early stage of the design process, to find positions on the test object 12 which are sensitive to interference. When the immunity of the areas sensitive to interference have been improved, it is, thus, very easy to repeat the measurement under the same conditions which existed during the first measurement, which has not been possible with hitherto known methods.

The result, measurement settings and the coordinate table settings for each measurement can be stored in the computer 18 and constitute an excellent basis for the documentation of the advancement of the design process regarding immunity. Of course, the result can also, by known means, be printed out by the printer 22.

EXAMPLE 3: Temperature Measurement

Figure 3:
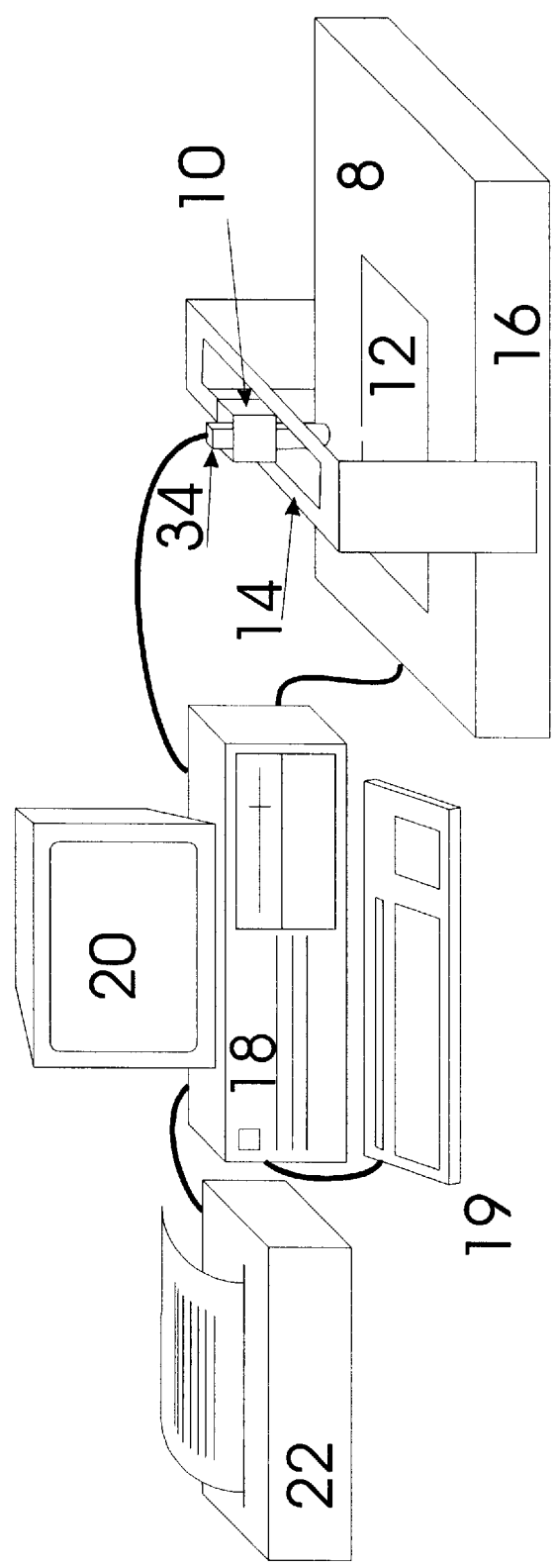
FIG. 3 shows an embodiment in which the system according to the present invention is used to measure temperature.
Figure 6:
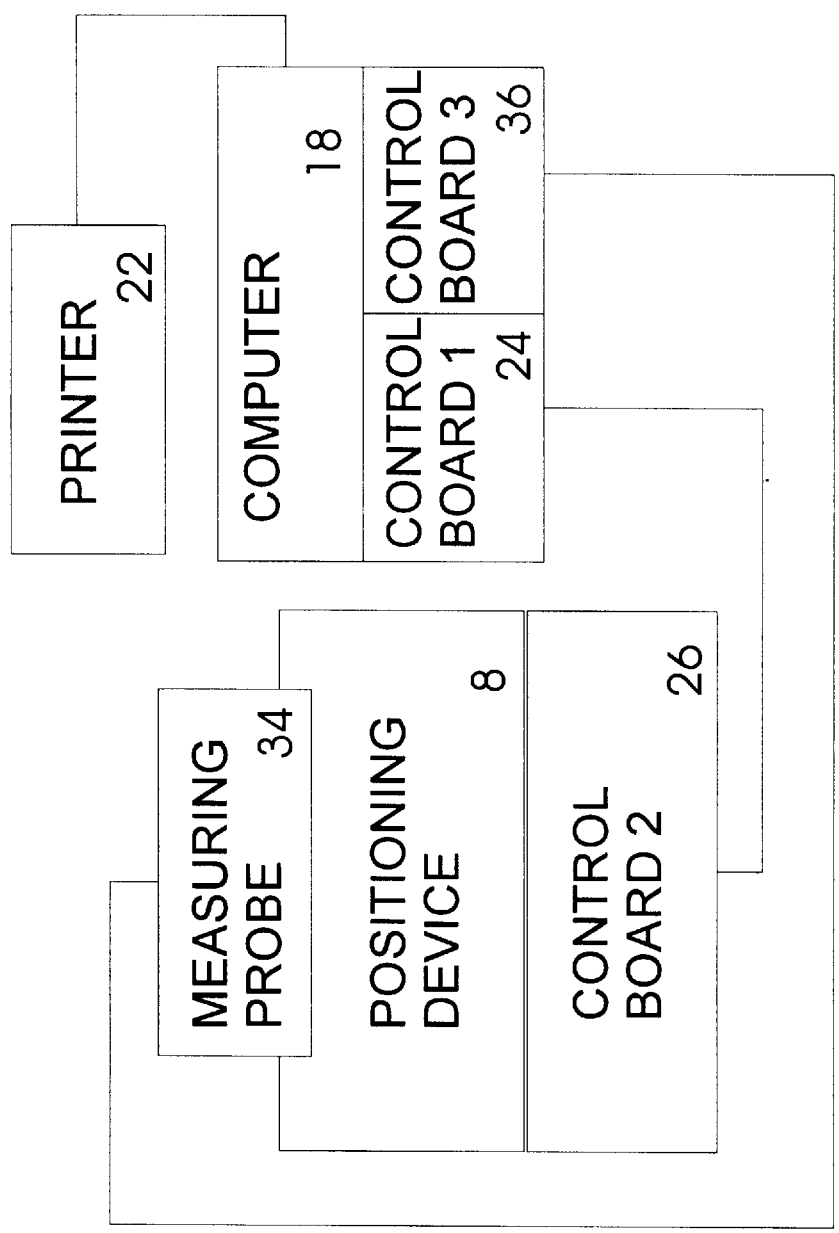
FIG. 6 is a circuit diagram showing the embodiment depicted in FIG. 3.

The system shown in FIG. 3 and FIG. 6 for measuring the temperature comprises in substance the same parts as the system in FIG. 2 and FIG. 5. Same parts use the same reference numerals in both figures. The difference between the two systems is that instead of having a spark device 30 the system for measuring temperature has a measuring probe 34 which measures temperature without making contact. The third control board 36 in the system for measuring temperature has, in addition, a different design than the third control board 32 in the system for measuring immunity. The measuring probe 34 is via a third control board 36 connected to the computer 18 and provided on the slider 10 in a similar way as the measuring probe 4 in the first example. The coordinate table 8 is controlled by the computer 18 in the same manner as in the two examples above. Also in this example the computer 18 is used to collect, process and visualise measurement data.

Below, the method for measuring the temperature of a test object 12 will now be described.

The system in this example must, as in previous examples, be configured prior to the first measurement in order to define which hardware is to be included in the system.

Besides the configuration, the method for measuring temperature comprises the following steps:
1. Initiate the measuring program.
2. Selection of the form, "Settings—coordinate table". In this form the user specifies, for example, start and end coordinates, increments in the x- and y- direction, start direction, speed, whether the z- coordinate should be fixed or relative, etc., to be used in the measuring method.
3. Selection of the form "Measurement settings—temperature measurement". In this form the user specifies, for example, the test object's 12 surface structure upper and lower temperature limits.
4. Initiation of the measurement by selecting the alternative "Measure" in the menu for temperature measurement.
5. Showing the results of the measurement by selecting the alternative "Visualise" in the menu for temperature measurement.
6. Documentation of the results of the measurement by selecting the alternative "Print" in the menu for temperature measurement.

Figure 9:
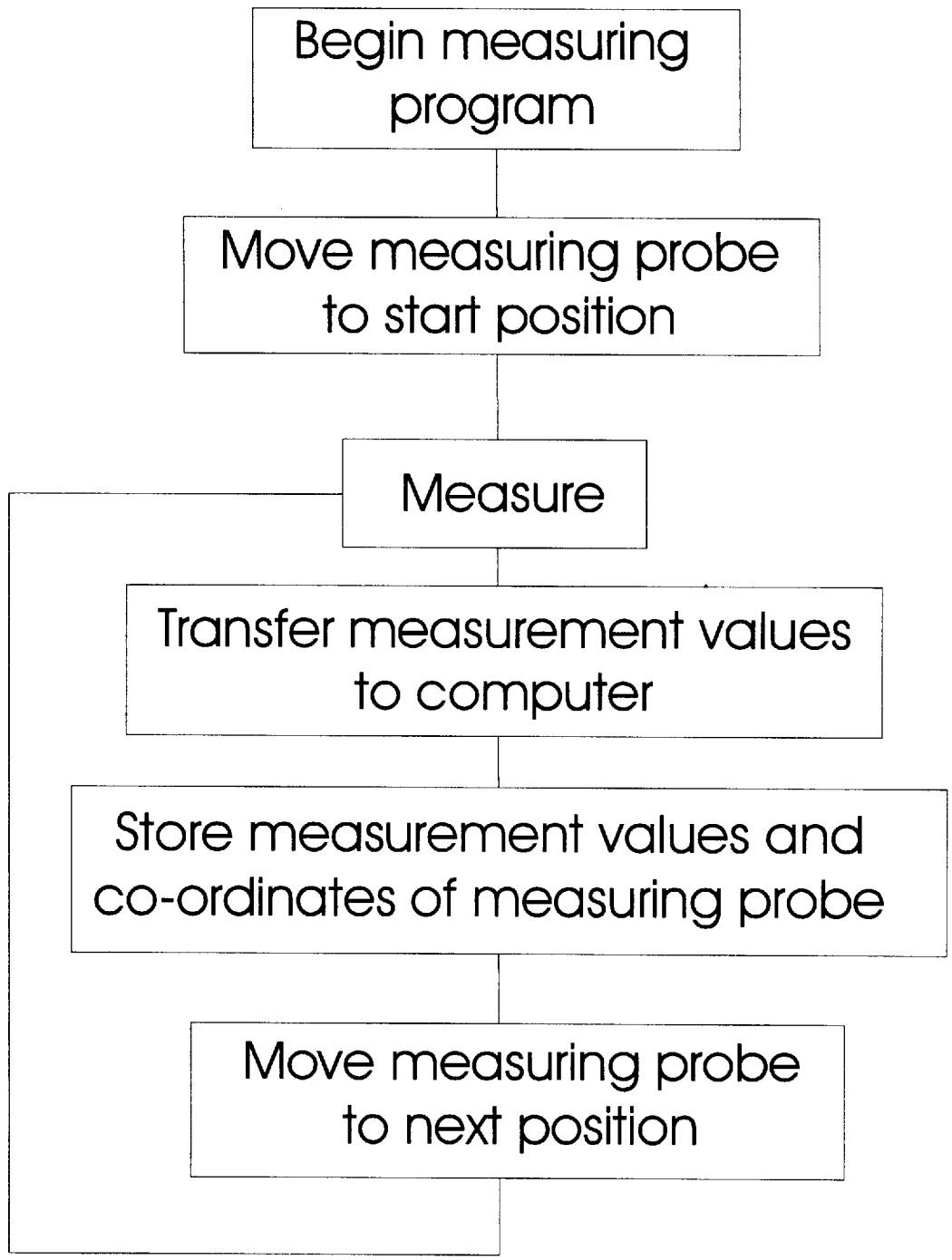
FIG. 9 is a flow-chart showing the method for measuring the temperature according to the invention.

The measuring method, i.e. step 4 above, will now be described in detail. The measuring method is shown with the help of a flow-chart in FIG. 9.

When all settings for the measurement have been made and the measurement has been activated by selecting "Measure" in the menu for temperature measurement, the program commands the coordinate table 8, via the primary control board 24, to move the measuring probe 34 to the start coordinates given in the form "Settings coordinate table". When the arm 14 and the slider 10, which hold the measuring probe 34 have reached the start coordinates above the test object 12 the measurement values are collected by the computer 18, via the third control board 36, and stored together with the position of the measuring probe 34 in the computer's 18 memory. The program now commands the coordinate table 8 to relocate the measuring probe 34 to the next coordinates according to the conditions specified in the form "Settings—coordinate table". The measuring method then continues, as above, and is terminated when the measuring probe 34 reaches its end coordinates and the computer 18 has collected the final measurement values.

In order to illustrate the test object's 12 temperature after the measurement, "Visualise" is selected from the menu. The measurement values which have been processed by the computer 18 are here shown in diagrammatic form with up to four dimensions, e.g. in the form of a temperature/position diagram.

With the help of the temperature measurement, the designer is given a good picture of how the temperature fluctuates across the test object 12. With this information it is then easy to optimise the cooling of the test object 12 thereby increasing the life span of the product of which the test object 12 is a part.

As in both previous examples, the result and the various settings can be stored in the computer's 18 memory in order to repeat the same measurement on a later occasion. The result can, of course, also in this example be printed out by a printer 22.

The three different embodiments and methods of the present invention which has been described above, are not intended to limit the scope of the invention but should rather be seen as a means of illustrating the invention.

It is also possible that the system, according to the present invention, can be designed to incorporate all three of the above mentioned systems and said measuring methods could be carried out almost simultaneously. This is readily done by a person skilled in the art given the above examples and therefore not described in greater detail.

It is also possible that the positioning device 8, which holds the measuring means, scans the test object 12 continuously rather than by increments. This is particularly useful for a rough and quick estimation of the test object's 12 EMC.

When the measuring means scan the test object 12 continuously, as mentioned above, the control electronics of the positioning device 8 are not shut off. This, of course, requires that the control electronics do not cause interference with the actual measurement. Furthermore, it is important to keep the measuring time for the measuring means 4, 30 and 34 as short as possible, otherwise the movement of the measuring means 4, 30 and 34 will influence the result of the measurement.

It should also be noted that a test object could in the case of measuring the EMC be any object that causes or is affected by interference, and in the case of measuring the temperature the test object could be virtually any object, of which the temperature is of interest. For example could the measuring method for the temperature measurement, described in the third example above, be used for medical purposes, i.e. measuring the temperature of a human body.

We claim:

1. A system for repeatedly, by means of a positioning device (8), moving a measuring means (4, 30) to a plurality of measuring positions, comprising a control means with a memory means (18) connected to the positioning device (8) for controlling said positioning device (8) from one position to another, and wherein the measuring means (4, 30) is connected to the control means with a memory means (18) for storing the measurement values obtained by the measuring means (4, 30) in the memory means (18) together with the coordinates of the measuring means (4, 30), the measuring means (4, 30) being designed to measure EMC at preselected positions above a test object (12), the positioning device (8) being arranged to move the measuring means (4, 30) in the x-, y-, and z-direction, and the control means being designed to be dead during the measurement of the EMC.

2. System according to claim 1, wherein the control means with the memory means is a computer (18).

3. System according to claim 2, wherein said measuring means comprises a measuring probe (4) for measuring the emission of the test object (12), said measuring probe (4) being connected; via an optional amplifier (6), to a spectrum analyser (2) and said spectrum analyser (2) being connected to a computer (18).

4. System according to claim 2, wherein said measuring means comprises a spark device (30) for measuring immunity of the test object (12), said spark device (30) being connected to the computer (18), and said computer (18) being connected to the test object (12) for obtaining measurement values responsive to an interference signal generated by the spark device (30).

5. System according to claim 2, wherein the test object (12) is an electrically or electronically equipped printed board.

6. A method for measuring EMC on a test object (12), comprising the steps of moving a measuring means (4, 30), by means of a positioning device (8), in the x-, y- and z-direction above a test object (12) from one position to another, measuring the EMC of said test object at at least one of said positions, during which measurement the control means of the positioning device (8) is made dead, preselecting and storing the number of said positions and their coordinates in a computer (18) for a later repetition of the measurement, and assigning each position with a value of measurement, which is stored in memory of computer (18) together with the coordinates of said measuring means (4, 30).

7. Method according to claim 6, for measuring emission on the test object (12), comprising the steps of:

1. commanding by means of the computer (18) the positioning device (8) to move a measuring probe (4) to a preselected start position,
2. making the control electronics of the positioning device (8) dead,
3. commanding by means of the computer (18) carrying out the measurement according to preselected conditions,
4. collecting by means of the spectrum analyser (2) the measurement values from measuring probe (4) which is provided on the positioning device (8) and which is positioned above the test object (12),
5. transferring the measurement values to the computer (18),
6. storing the measurement values together with the coordinates of the measuring probe (4) in the memory of the computer (18),
7. reactivating the control electronics of the positioning device, (8) and
8. commanding by means of the computer (18) the positioning device (8) to move the measuring probe (4) to next preselected position at which steps 2–7 are repeated until the measuring probe (4) has reached a final preselected position and steps 2–7 have been carried out one final time.

8. Method according to claim 6 for measuring immunity on the test object (12), comprising the steps of:

1. commanding by means of the computer (18) the positioning device (8) to move the spark device (30) to a preselected start position,
2. making the control electronics of the positioning device (8) dead,
3. sending by means of the computer (18) a control signal to a spark device (30), which generates an interference signal,
4. collecting a trigger signal from the test object (12) by the computer (18),
5. storing the trigger signal together with the coordinates of the spark device (30) in the memory of the computer (18),
6. reactivating the control electronics of the positioning device (8), and
7. commanding by means of the computer (18) the positioning device (8) to move the spark device (30) to next preselected position at which steps 2–6 are repeated until the spark device (30) has reached a final preselected position and steps 2–6 have been carried out one final time.

9. Method according to claim 6 wherein the test object (12) is an electrically or electronically equipped printed board.

10. Method according to claim 7, wherein the test object (12) is an electrically or electronically equipped printed board.

11. Method according to claim 8, wherein the test object (12) is an electrically or electronically equipped printed board.

* * * * *